US007613219B2

(12) United States Patent
Haberern et al.

(10) Patent No.: US 7,613,219 B2
(45) Date of Patent: Nov. 3, 2009

(54) SEMICONDUCTOR DEVICES HAVING SELF ALIGNED SEMICONDUCTOR MESAS AND CONTACT LAYERS

(75) Inventors: Kevin Ward Haberern, Cary, NC (US); Raymond Rosado, Apex, NC (US); Michael John Bergman, Chapel Hill, NC (US); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 489 days.

(21) Appl. No.: 11/520,383

(22) Filed: Sep. 13, 2006

(65) Prior Publication Data

US 2007/0007544 A1    Jan. 11, 2007

Related U.S. Application Data

(62) Division of application No. 10/741,705, filed on Dec. 19, 2003, now Pat. No. 7,160,747.

(60) Provisional application No. 60/435,213, filed on Dec. 20, 2002, provisional application No. 60/434,914, filed on Dec. 20, 2002, provisional application No. 60/434,999, filed on Dec. 20, 2002, provisional application No. 60/435,211, filed on Dec. 20, 2002.

(51) Int. Cl.
*H01S 5/028* (2006.01)
*H01L 29/06* (2006.01)
*H01L 51/50* (2006.01)

(52) U.S. Cl. ............ 372/49.01; 372/50.1; 257/626

(58) Field of Classification Search ............ 372/49.01, 372/50.1; 257/626
See application file for complete search history.

(56) References Cited

U.S. PATENT DOCUMENTS

| 3,833,435 A | 9/1974 | Logan et al. |
| 3,865,646 A | 2/1975 | Logan et al. |
| 3,938,173 A | 2/1976 | Jackson et al. |

(Continued)

FOREIGN PATENT DOCUMENTS

EP    1039600 A2    9/0000

(Continued)

OTHER PUBLICATIONS

English Translation of Chinese Second Office Action (6 pages) corresponding to Chinese Patent Application No. 200380107146.6; Issue Date: Jan. 9, 2009.

(Continued)

*Primary Examiner*—Evan Pert
(74) *Attorney, Agent, or Firm*—Myers Bigel Sibley & Sajovec, P.A.

(57) ABSTRACT

Methods of forming a semiconductor device can include forming a semiconductor structure on a substrate, the semiconductor structure having mesa sidewalls and a mesa surface opposite the substrate. A contact layer can be formed on the mesa surface wherein the contact layer has sidewalls and a contact surface opposite the mesa surface and wherein the contact layer extends across substantially an entirety of the mesa surface. A passivation layer can be formed on the mesa sidewalls and on portions of the contact layer sidewalls adjacent the mesa surface, and the passivation layer can expose substantially an entirety of the contact surface of the contact layer. Related devices are also discussed.

29 Claims, 6 Drawing Sheets

U.S. PATENT DOCUMENTS

| | | | |
|---|---|---|---|
| 4,032,944 A | 6/1977 | van Dongen et al. | |
| 4,053,914 A | 10/1977 | Goodwin | |
| 4,084,130 A | 4/1978 | Holton | |
| 4,099,305 A | 7/1978 | Cho et al. | |
| 4,142,160 A | 2/1979 | Tsukada et al. | |
| 4,236,122 A | 11/1980 | Cho et al. | |
| 4,276,098 A | 6/1981 | Nelson et al. | |
| 4,531,142 A | 7/1985 | Weyrich et al. | |
| 4,754,462 A | 6/1988 | Yamamoto et al. | |
| 4,966,862 A | 10/1990 | Edmond | |
| 5,003,548 A | 3/1991 | Bour et al. | |
| 5,128,276 A | 7/1992 | Ambrosius et al. | |
| 5,187,108 A | 2/1993 | Shinozawa | |
| 5,208,183 A | 5/1993 | Chen et al. | |
| 5,243,204 A | 9/1993 | Suzuki et al. | |
| 5,260,230 A | 11/1993 | Kondo | |
| 5,276,699 A | 1/1994 | Kahen | |
| 5,387,804 A | 2/1995 | Suzuki et al. | |
| 5,388,116 A | 2/1995 | Ohkubo et al. | |
| 5,416,342 A | 5/1995 | Edmond et al. | |
| 5,418,190 A | 5/1995 | Cholewa et al. | |
| 5,429,954 A | 7/1995 | Gerner | |
| 5,470,785 A | 11/1995 | Kondo | |
| 5,478,775 A | 12/1995 | Fujii | |
| 5,499,260 A | 3/1996 | Takahashi et al. | |
| 5,559,053 A * | 9/1996 | Choquette et al. | 438/41 |
| 5,574,743 A | 11/1996 | Va der Poel et al. | |
| 5,631,190 A | 5/1997 | Negley | |
| 5,650,339 A | 7/1997 | Saito et al. | |
| 5,661,074 A | 8/1997 | Tischler | |
| 5,668,049 A | 9/1997 | Chakrabarti et al. | |
| 5,693,558 A | 12/1997 | Lee et al. | |
| 5,789,275 A | 8/1998 | Lee et al. | |
| 5,834,329 A | 11/1998 | Kim | |
| 5,838,706 A | 11/1998 | Edmond et al. | |
| 5,874,747 A | 2/1999 | Redwing et al. | |
| 5,912,477 A | 6/1999 | Negley | |
| 5,915,187 A | 6/1999 | Huisman et al. | |
| 5,916,460 A | 6/1999 | Imoto et al. | |
| 5,923,053 A | 7/1999 | Jakowetz et al. | |
| 5,923,946 A | 7/1999 | Negley | |
| 5,972,781 A | 10/1999 | Wegleiter et al. | |
| 6,048,748 A | 4/2000 | Khare et al. | |
| 6,120,600 A | 9/2000 | Edmond et al. | |
| 6,134,368 A | 10/2000 | Sakata | |
| 6,187,606 B1 | 2/2001 | Edmond et al. | |
| 6,200,826 B1 | 3/2001 | Kim | |
| 6,201,262 B1 | 3/2001 | Edmond et al. | |
| 6,204,161 B1 | 3/2001 | Chung et al. | |
| 6,232,623 B1 * | 5/2001 | Morita | 257/103 |
| 6,255,198 B1 | 7/2001 | Linthicum et al. | |
| 6,345,064 B1 | 2/2002 | Fujii | |
| 6,349,104 B1 | 2/2002 | Kato et al. | |
| 6,365,968 B1 | 4/2002 | Qian et al. | |
| 6,370,176 B1 * | 4/2002 | Okumura | 372/45.01 |
| 6,373,077 B1 | 4/2002 | Edmond et al. | |
| 6,376,866 B1 | 4/2002 | Shakuda | |
| 6,413,839 B1 | 7/2002 | Brown et al. | |
| 6,420,252 B1 | 7/2002 | Schwed et al. | |
| 6,432,735 B1 | 8/2002 | Cho et al. | |
| 6,432,788 B1 | 8/2002 | Maruska et al. | |
| 6,456,640 B1 * | 9/2002 | Okumura | 372/46.01 |
| 6,459,100 B1 | 10/2002 | Doverspike et al. | |
| 6,475,889 B1 | 11/2002 | Ring | |
| 6,512,783 B1 | 1/2003 | Yamamoto et al. | |
| 6,577,662 B1 * | 6/2003 | Asano et al. | 372/46.01 |
| 6,580,054 B1 | 6/2003 | Liu et al. | |
| 6,614,824 B2 * | 9/2003 | Tsuda et al. | 372/46.01 |
| 6,642,546 B2 * | 11/2003 | Kuramoto et al. | 257/94 |
| 6,656,759 B2 * | 12/2003 | Nakanishi et al. | 438/39 |
| 6,677,173 B2 | 1/2004 | Ota | |
| 6,711,191 B1 * | 3/2004 | Kozaki et al. | 372/43.01 |
| 6,744,800 B1 * | 6/2004 | Kneissl et al. | 372/50.1 |
| 6,746,948 B2 * | 6/2004 | Ueda et al. | 438/604 |
| 6,756,611 B2 * | 6/2004 | Kiyoku et al. | 257/103 |
| 6,764,870 B2 * | 7/2004 | Okumura | 438/46 |
| 6,784,010 B2 * | 8/2004 | Yamaguchi et al. | 438/39 |
| 6,825,501 B2 | 11/2004 | Edmond et al. | |
| 6,925,101 B2 * | 8/2005 | Matsumura | 372/46.01 |
| 6,946,682 B2 | 9/2005 | Slater, Jr. et al. | |
| 7,033,854 B2 * | 4/2006 | Morita | 438/40 |
| 7,042,011 B2 * | 5/2006 | Takatani | 257/78 |
| 7,103,082 B2 * | 9/2006 | Sugimoto et al. | 372/50.1 |
| 7,470,555 B2 * | 12/2008 | Matsumura | 438/22 |
| 2002/0022290 A1 | 2/2002 | Kong et al. | |
| 2002/0034204 A1 | 3/2002 | Iwamoto et al. | |
| 2002/0048835 A1 | 4/2002 | Kwak | |
| 2002/0072250 A1 | 6/2002 | Jeong et al. | |
| 2002/0093020 A1 | 7/2002 | Edmond et al. | |
| 2002/0110945 A1 | 8/2002 | Kuramata et al. | |
| 2002/0123164 A1 | 9/2002 | Slater et al. | |
| 2002/0159494 A1 | 10/2002 | Tojo et al. | |
| 2003/0006418 A1 | 1/2003 | Emerson et al. | |
| 2003/0006425 A1 | 1/2003 | Bol et al. | |
| 2003/0015721 A1 | 1/2003 | Slater et al. | |
| 2003/0020061 A1 | 1/2003 | Emerson et al. | |
| 2003/0025121 A1 | 2/2003 | Edmond et al. | |
| 2003/0042507 A1 | 3/2003 | Slater, Jr. et al. | |
| 2003/0045015 A1 | 3/2003 | Slater et al. | |
| 2003/0128729 A1 * | 7/2003 | Matsumura | 372/46 |
| 2003/0138981 A1 * | 7/2003 | Yamaguchi et al. | 438/22 |
| 2003/0206567 A1 * | 11/2003 | Takatani | 372/45 |
| 2003/0209722 A1 * | 11/2003 | Hatakoshi et al. | 257/98 |
| 2004/0051118 A1 | 3/2004 | Bruhns et al. | |
| 2004/0075160 A1 | 4/2004 | Eng et al. | |
| 2004/0147054 A1 * | 7/2004 | Haberern et al. | 438/39 |
| 2004/0245535 A1 * | 12/2004 | D'Evelyn et al. | 257/94 |
| 2005/0167835 A1 * | 8/2005 | Tomiya et al. | 257/744 |
| 2005/0170542 A1 * | 8/2005 | Matsumura | 438/31 |
| 2005/0196888 A1 * | 9/2005 | Morita | 438/44 |
| 2006/0018353 A1 * | 1/2006 | Hata et al. | 372/46.01 |
| 2007/0228395 A1 * | 10/2007 | Kamiyama et al. | 257/79 |
| 2008/0135982 A1 * | 6/2008 | Haberern et al. | 257/626 |

FOREIGN PATENT DOCUMENTS

| | | |
|---|---|---|
| EP | 0 450 255 A1 | 10/1991 |
| EP | 0 653 823 A2 | 5/1995 |
| EP | 1 104 947 A2 | 6/2001 |
| EP | 1 146 616 A2 | 10/2001 |
| FR | 2 613 547 | 10/1988 |
| GB | 406 665 | 2/1934 |
| GB | 1 223 196 | 2/1971 |
| JP | 09270528 | 10/1997 |
| JP | 09270528 A | 1/1998 |
| JP | 2000-223742 A | 8/2000 |
| WO | WO 01/95446 A1 | 12/2001 |
| WO | WO 02/37578 A1 | 5/2002 |
| WO | WO 03/030271 A2 | 4/2003 |
| WO | WO 03/030271 A3 | 4/2003 |
| WO | WO 03/010817 A2 | 6/2003 |
| WO | WO 03/010817 A3 | 6/2003 |
| WO | WO 2004/047244 A1 | 6/2004 |

OTHER PUBLICATIONS

Chinese Office Action of Mar. 9, 2007 for Chinese Application No. 200380107070.7.

English Translation of Chinese Office Action of Mar. 9, 2007 for Chinese Application No. 200380107070.7.

Chinese Office Action of Apr. 20, 2007 for Chinese Application No. 200380107146.6.

English Translation of Chinese Office Action of Apr. 20, 2007 for Chinese Application No. 200380107146.6.

International Search Report for PCT/US 03/22411, mailed Jul. 6, 2004.

International Search Report for PCT/US03/40377, mailed Jan. 20, 2005.

Nakamura et al., "Ridge-geometry InGaN multi-quantum-well-structure laser diodes," *Appl. Phys. Lett*, 10:1477-1479 (Sep. 2, 1996).

International Search Report for PCT/US 03/40483 mailed Nov. 30, 2004.

International Search Report for PCT/US 03/40682 mailed Nov. 3, 2004.

Koren et al., "InGaAsP/InP undercut mesa laser with planar polyimide passivation", *Applied Physics Letter*, 42(5) 403-405, Nov. 2003.

PCT International Search Report for PCT/US 03/40379, Jan. 2005.

Sze, Physics of Semiconductor Devices, $2^{nd}$ Edition chapter 12.4 "Semiconductor Laser Physics" (1981) pp. 704-742.

D.A.B. Miller; "Semiconductor lasers", Semiconductor Optoelectronic Devices pp. 164-178 (Winter 2002).

I. Stateikina; "Optoelectronic Semiconductor Devices—Principals and Characteristics", 76 pages; http://www.ece.concordia.ca/~i_statei/vlsi-opt/.

C.H. Chang, L. Chrostowski & C.J. Chang-Hasnain, "Parasitics and Design Considerations on Oxide-Implant VCSELs", IEEE Photonics Technology Letters, vol. 13, No. 12, pp. 1274-1276 (Dec. 2001).

Christoper LaBounty et al; Monolithic Integration of Solid State Thermionic Coolers with Semiconductor Lasers; Conference Proceedings of IEEE/LEOS $13^{th}$ Annual Meeting (LEOS 2000), Rio Grande, Puerto Rico (Nov. 2000) http://www.ece.ucsb.edu/uoeg/research/publicatons/papers/labounty00leos.pdf.

Harold Fetterman, David Scott & D.P. Prakash; "Traveling Wave HPT Technology with Integrated Polymide Optical Waveguides" Final Report for 1999-00 for Micro Project 99-037 Industrial Sponsor: Raytheon Systems Company. http://www.ucop.edu/research/micro/99_00/99_037.pdf.

"Strained Layer Semiconductor Laser Devices" http://www.microfanatic.com/lasers.html; 5 pages.

A Brief History of Up: Introduction Previous: Introduction: http://www.physics.ucc.ie/opto/hegarty/node3.html.

* cited by examiner

SEMICONDUCTOR DEVICES HAVING SELF ALIGNED SEMICONDUCTOR MESAS AND CONTACT LAYERS

RELATED APPLICATIONS

The present application is a divisional of Application Ser. No. 10/741,705, filed Dec. 19, 2003, now U.S. Pat. No. 7,160, 747 entitled "Methods of Forming Semiconductor Devices Having Self Aligned Semiconductor Mesas and Contact Layers", and claims the benefit of: U.S. Provisional Application No. 60/435,213 filed Dec. 20, 2002, and entitled "Laser Diode With Self-Aligned Index Guide And Via"; U.S. Provisional Application No. 60/434,914 filed Dec. 20, 2002, and entitled "Laser Diode With Surface Depressed Ridge Wave guide"; U.S. Provisional Application No. 60/434,999 filed Dec. 20, 2002 and entitled "Laser Diode with Etched Mesa Structure"; and U.S. Provisional Application No. 60/435,211 filed Dec. 20, 2002, and entitled "Laser Diode With Metal Current Spreading Layer." The disclosures of each of these applications are hereby incorporated herein in their entirety by reference.

The present application is also related to: U.S. application Ser. No. 10/741,334, filed Dec. 19, 2003, entitled "Methods Of Forming Semiconductor Mesa Structures Including Self-Aligned Contact Layers And Related Devices"; U.S. application Ser. No. 10/741,240, filed Dec. 19, 2003, entitled "Methods Of Forming Semiconductor Devices Including Mesa Structures And Multiple Passivation Layers And Related Devices"; and U.S. application Ser. No. 10/472,426, filed Dec. 19, 2003, entitled "Methods of Forming Electronic Devices Including Semiconductor Mesa Structures And Conductivity Junctions And Related Devices". The disclosures of each of these U.S. applications are hereby incorporated herein in their entirety by reference.

FIELD OF THE INVENTION

The present invention relates to the field of electronics, and more particularly, to methods of forming electronic semiconductor devices and related structures.

BACKGROUND

A laser is a device that produces a beam of coherent monochromatic light as a result of stimulated emission of photons. Stimulated emission of photons may also produce optical gain, which may cause light beams produced by lasers to have a high optical energy. A number of materials are capable of producing the lasing effect and include certain high-purity crystals (ruby is a common example), semiconductors, certain types of glass, certain gases including carbon dioxide, helium, argon and neon, and certain plasmas.

More recently, lasers have been developed in semiconducting materials, thus taking advantage of the smaller size, lower cost and other related advantages typically associated with semiconductor devices. In the semiconductor arts, devices in which photons play a major role are referred to as "photonic" or "optoelectronic" devices. In turn, photonic devices include light-emitting diodes (LEDs), photodetectors, photovoltaic devices, and semiconductor lasers.

Semiconductor lasers are similar to other lasers in that the emitted radiation has spatial and temporal coherence. As noted above, laser radiation is highly monochromatic (i.e., of narrow band width) and it produces highly directional beams of light. Semiconductor lasers may differ, however, from other lasers in several respects. For example, in semiconductor lasers, the quantum transitions are associated with the band properties of materials; semiconductor lasers may be very compact in size, may have very narrow active regions, and larger divergence of the laser beam; the characteristics of a semiconductor laser may be strongly influenced by the properties of the junction medium; and for P-N junction lasers, the lasing action is produced by passing a forward current through the diode itself. Overall, semiconductor lasers can provide very efficient systems that may be controlled by modulating the current directed across the devices. Additionally, because semiconductor lasers can have very short photon lifetimes, they may be used to produce high-frequency modulation. In turn, the compact size and capability for such high-frequency modulation may make semiconductor lasers an important light source for optical fiber communications.

In broad terms, the structure of a semiconductor laser should provide optical confinement to create a resonant cavity in which light amplification may occur, and electrical confinement to produce high current densities to cause stimulated emission to occur. Additionally, to produce the laser effect (stimulated emission of radiation), the semiconductor may be a direct bandgap material rather than an indirect bandgap material. As known to those familiar with semiconductor characteristics, a direct bandgap material is one in which an electron's transition from the valence band to the conduction band does not require a change in crystal momentum for the electron. Gallium arsenide and gallium nitride are examples of direct bandgap semiconductors. In indirect bandgap semiconductors, the alternative situation exists; i.e., a change of crystal momentum is required for an electron's transition between the valence and conduction bands. Silicon and silicon carbide are examples of such indirect semiconductors.

A useful explanation of the theory, structure and operation of semiconductor lasers, including optical and electronic confinement and mirroring, is given by Sze, Physics of Semiconductor Devices, 2nd Edition (1981) at pages 704-742, and these pages are incorporated entirely herein by reference.

As known to those familiar with photonic devices such as LEDs and lasers, the frequency of electromagnetic radiation (i.e., the photons) that can be produced by a given semiconductor material may be a function of the material's bandgap. Smaller bandgaps produce lower energy, longer wavelength photons, while wider bandgap materials produce higher energy, shorter wavelength photons. For example, one semiconductor commonly used for lasers is aluminum indium gallium phosphide (AlInGaP). Because of this material's bandgap (actually a range of bandgaps depending upon the mole or atomic fraction of each element present), the light that AlInGaP can produce may be limited to the red portion of the visible spectrum, i.e., about 600 to 700 nanometers (nm). In order to produce photons that have wavelengths in the blue or ultraviolet portions of the spectrum, semiconductor materials having relatively large bandgaps may be used. Group III-nitride materials such as gallium nitride (GaN), the ternary alloys indium gallium nitride (InGaN), aluminum gallium nitride (AlGaN) and aluminum indium nitride (AlInN) as well as the quaternary alloy aluminum gallium indium nitride (AlInGaN) are attractive candidate materials for blue and UV lasers because of their relatively high bandgap (3.36 eV at room temperature for GaN). Accordingly, Group III-nitride based laser diodes have been demonstrated that emit light in the 370-420 nm range.

A number of commonly assigned patents and co-pending patent applications likewise discuss the design and manufacture of optoelectronic devices. For example, U.S. Pat. Nos. 6,459,100; 6,373,077; 6,201,262; 6,187,606; 5,912,477; and 5,416,342 describe various methods and structures for gallium-nitride based optoelectronic devices. U.S. Pat. No. 5,838,706 describes low-strain nitride laser diode structures. Published U.S. Application Nos. 20020093020 and 20020022290 describe epitaxial structures for nitride-based optoelectronic devices. Various metal contact structures and bonding methods, including flip-chip bonding methods, are described in Published U.S. Application No. 20020123164 as well as Published U.S. Application No. 030045015 entitled "Flip Chip Bonding of Light Emitting Devices and Light Emitting Devices Suitable for Flip-Chip Bonding"; Published U.S. Application No. 20030042507 entitled "Bonding of Light Emitting Diodes Having Shaped Substrates and Collets for Bonding of Light Emitting Diodes Having Shaped Substrates", and Published U.S. Application No. 20030015721 entitled "Light Emitting Diodes Including Modifications for Submount Bonding and Manufacturing Methods Therefor." Dry etching methods are described in U.S. Pat. No. 6,475,889. Passivation methods for nitride optoelectronic devices are described in U.S. application Ser. No. 08/920,409 entitled "Robust Group III Light Emitting Diode for High Reliability in Standard Packaging Applications" and Published U.S. Application No. 20030025121 entitled "Robust Group III Light Emitting Diode for High Reliability in Standard Packaging Applications." Active layer structures suitable for use in nitride laser diodes are described in Published U.S. Application No. 20030006418 entitled "Group III Nitride Based Light Emitting Diode Structures with a Quantum Well and Superlattice, Group III Nitride Based Quantum Well Structures and Group III Nitride Based Superlattice Structures" and Published U.S. Application No. 20030020061 entitled "Ultraviolet Light Emitting Diode." The contents of all of the foregoing patents, patent applications and published patent applications are incorporated entirely herein by reference as if fully set forth herein.

Vulnerable portions of conventional semiconductor laser devices, however, may be subject to damage during fabrication and/or subsequent packaging. Moreover, electrically vulnerable portions of conventional semiconductor laser devices may result in current leakage, electrical short circuits, and/or increased lasing thresholds.

SUMMARY

According to embodiments of the present invention, methods of forming semiconductor devices may include forming a semiconductor layer on a substrate, forming a conductive layer on the semiconductor layer opposite the substrate, and forming a mask on the conductive layer opposite the semiconductor layer. Portions of the conductive layer and the semiconductor layer exposed by the mask may be selectively removed while maintaining the mask to define a semiconductor mesa having mesa sidewalls between the mask and the substrate and a mesa surface opposite the substrate and defining a contact layer on the mesa surface between the semiconductor mesa and the mask. A passivation layer can be formed on the mask and on the mesa sidewalls, and the mask and portions of the passivation layer on the mask can be removed. More particularly, the contact layer may provide ohmic contact with the semiconductor mesa.

While selectively removing portions of the metal layer, by-products of the conductive layer may be redeposited on sidewalls of the mask. Accordingly, an effective width of the mask may increase as the conductive layer is removed. In addition, the mesa may be configured to provide at least one of optical confinement or current confinement for a light emitting device in the semiconductor structure. Moreover, the mesa sidewalls may be free of the conductive contact layer.

The semiconductor layer can be a Group III-V semiconductor material such as a Group III-nitride semiconductor material, and forming the semiconductor layer may include forming an epitaxial semiconductor layer. Moreover, the semiconductor layer may include a first layer of a first conductivity type (such as N-type) and a second layer of a second conductivity type (such as P-type) on the first layer opposite the substrate. More particularly, removing portions of the semiconductor layer may include removing portions of the second layer of the second conductivity type without removing portions of the first layer of the first conductivity type. In an alternative, removing portions of the semiconductor layer may include removing portions of the first and second layers. In addition, the semiconductor layer may include an active layer between the first and second layers.

Portions of the semiconductor layer included in the mesa may have a thickness in the range of approximately 0.1 to 5 microns or more, and more particularly, portions of the semiconductor layer included in the mesa may have a thickness of less than approximately 2.5 microns. In addition, the mesa surface may have a width in the range of approximately 1 to 3 microns or more at an interface with the contact layer.

After removing the mask and portions of the passivation layer on the mask, methods according to embodiments of the present invention may also include forming a conductive overlayer on the mesa surface and on portions of the passivation layer surrounding the contact layer. The conductive overlayer may include a metal layer such as a layer of nickel (Ni), gold (Au), platinum (Pt), titanium (Ti), tungsten (W), molybdenum (Mo), tantalum (Ta), and/or palladium (Pd). The passivation layer may include an insulating layer such as a layer of silicon nitride, silicon oxide, and/or aluminum oxide. Moreover, forming the passivation layer may include depositing the passivation layer using chemical vapor deposition (CVD), plasma enhanced chemical vapor deposition (PECVD), low pressure chemical vapor deposition (LPCVD), sputtering, and/or e-beam evaporation.

The contact layer may include inwardly beveled sidewalls and a contact surface opposite the mesa surface, wherein the passivation layer extends onto the inwardly beveled sidewalls of the contact layer, and wherein the contact surface of the contact layer is free of the passivation layer. In addition, portions of the inwardly beveled sidewalls adjacent the contact surface may be free of the passivation layer. Sidewalls of the semiconductor mesa may have a first slope relative to the substrate, and sidewalls of the contact layer may have a second slope relative to the substrate, and the first slope can be greater than the second slope. In addition, selectively removing portions of the conductive layer and the semiconductor layer may include dry etching portions of the conductive layer and the semiconductor layer.

According to additional embodiments of the present invention, methods of forming semiconductor devices may include forming a semiconductor structure on a substrate wherein the semiconductor structure has mesa sidewalls and a mesa surface opposite the substrate. A contact layer is formed on the mesa surface wherein the contact layer has sidewalls and a contact surface opposite the mesa surface and the contact layer may extend substantially across an entirety of the mesa surface. A passivation layer is formed on the mesa sidewalls and on portions of the contact layer sidewalls adjacent the mesa surface, and the passivation layer exposes substantially an entirety of the contact surface of the contact layer.

The semiconductor structure may comprise a Group III-V semiconductor material such as a Group III-nitride semiconductor material. In addition, the semiconductor structure may include a first layer of a first conductivity type (such as N-type) and a second layer of a second conductivity type (such as P-type) on the first layer opposite the substrate. The mesa sidewalls may expose portions of the second layer of the second conductivity type without exposing portions of the first layer of the first conductivity type. In an alternative, the mesa sidewalls may expose portions of the first layer of the first conductivity type and portions of the second layer of the second conductivity type. The semiconductor structure may also include an active layer between the first and second layers.

Portions of the semiconductor structure included in the mesa may have a thickness in the range of approximately 0.1 to 5 microns, and more particularly, portions of the semiconductor structure included in the mesa have a thickness of less than approximately 2.5 microns. In addition, the mesa surface of the semiconductor structure may have a width in the range of approximately 1 to 3 microns.

Methods according to embodiments of the present invention may include forming a conductive overlayer on the exposed portions of the contact layer and on portions of the passivation layer surrounding the contact layer. The conductive overlayer comprises a metal layer such as a layer of nickel (Ni), gold (Au), platinum (Pt), titanium (Ti), tungsten (W), molybdenum (Mo), tantalum (Ta), and/or palladium (Pd). The passivation layer may include a layer of an insulating material such as silicon nitride, silicon oxide, and/or aluminum oxide. Moreover, forming the passivation layer may include depositing the passivation layer using chemical vapor deposition (CVD), plasma enhanced chemical vapor deposition (PECVD), low pressure chemical vapor deposition (LPCVD), sputtering, and/or e-beam evaporation.

The contact layer sidewalls may be inwardly beveled with the passivation layer extending onto the inwardly beveled sidewalls of the contact layer opposite the mesa surface. In addition or in an alternative, the mesa sidewalls of the semiconductor structure may have a first slope relative to the substrate and the contact layer sidewalls may have a second slope relative to the substrate wherein the second slope is less than the first slope.

Before forming the passivation layer, a mask can be maintained on the contact layer opposite the semiconductor substrate and forming the passivation layer can include forming the passivation layer on the mask. After forming the passivation layer, the mask and portions of the passivation layer on the mask can be removed. Accordingly, the contact surface of the contact layer can be maintained free of the passivation layer without using a masking operation to form a via hole through the passivation layer. In addition, forming the semiconductor structure and forming the contact layer may include forming a semiconductor layer on the substrate, forming a conductive layer on the semiconductor layer, and forming the mask on the conductive layer opposite the semiconductor layer. Portions of the conductive layer and the semiconductor layer exposed by the mask can then be removed to form the contact layer and the semiconductor structure. The passivation layer may also expose portions of the contact layer sidewalls adjacent the contact surface.

According to yet additional embodiment of the present invention, a semiconductor device may include a substrate, and a semiconductor structure on the substrate, the semiconductor structure having mesa sidewalls and a mesa surface opposite the substrate. A contact layer on the mesa surface has sidewalls and a contact surface opposite the mesa surface, and the contact layer extends substantially across an entirety of the mesa surface. A passivation layer is on the mesa sidewalls and on portions of the contact layer sidewalls adjacent the mesa surface, and the passivation layer exposes substantially an entirety of the contact surface of the contact layer.

The semiconductor structure may include a Group III-V semiconductor material such as a Group III-nitride semiconductor material. The semiconductor structure may include a first layer of a first conductivity type (such as N-type) and a second layer of a second conductivity type (such as P-type) on the first layer opposite the substrate. In addition, the mesa sidewalls may expose portions of the second layer of the second conductivity type without exposing portions of the first layer of the first conductivity type. In an alternative, the mesa sidewalls may expose portions of the first layer of the first conductivity type and portions of the second layer of the second conductivity type. The semiconductor structure may also include an active layer between the first and second layers.

Portions of the semiconductor structure included in the mesa may have a thickness in the range of approximately 0.1 to 5 microns, and more particularly, portions of the semiconductor structure included in the mesa may have a thickness of less than approximately 2.5 microns. The mesa surface of the semiconductor structure may have a width in the range of approximately 1 to 3 microns.

The semiconductor device may also include a conductive overlayer on the exposed portions of the contact layer and on portions of the passivation layer surrounding the contact layer. The conductive overlayer may include a metal layer such as a layer of nickel (Ni), gold (Au), platinum (Pt), titanium (Ti), tungsten (W), molybdenum (Mo), tantalum (Ta), and/or palladium (Pd). The passivation layer may include a layer of an insulating material such as silicon nitride, silicon oxide, and/or aluminum oxide.

The contact layer sidewalls may be inwardly beveled and the passivation layer may extend onto the inwardly beveled sidewalls of the contact layer opposite the mesa surface. Moreover, the passivation layer may expose portions of the contact layer sidewalls adjacent the contact surface. In addition, the mesa sidewalls of the semiconductor structure may have a first slope relative to the substrate and the contact layer sidewalls may have a second slope relative to the substrate wherein the second slope is less than the first slope.

DETAILED DESCRIPTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It will also be understood that when an element is referred to as being "coupled" or "connected" to another element, it can be directly coupled or connected to the other element, or intervening elements may also be present. Like numbers refer to like elements throughout. Furthermore, relative terms such as "vertical" and "horizontal" may be used herein to describe a relationship with respect to a substrate or base layer as illustrated in the figures. It will be understood that these terms are intended to encompass different orientations of the device in addition to the orientation depicted in the figures.

Group III-nitride materials may be made P-type by doping with P-type impurities (dopants) such as magnesium. However, P-type nitride semiconductor materials may provide relatively low carrier activation rates and relatively low carrier mobilities. Accordingly, P-type nitride semiconductor materials may be characterized by relatively high resistivities. Because laser diodes may require relatively high current levels to provide conditions for lasing, it may be beneficial for the ohmic contact to the p-type nitride material to cover as much surface area as possible.

Figure 1:
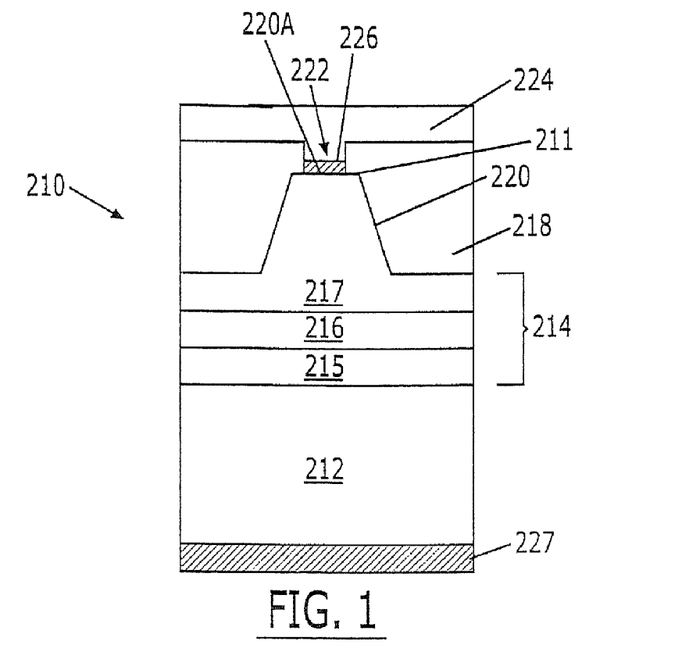
FIG. 1 is a cross-sectional view illustrating a mesa structure for a semiconductor laser.

FIG. 1 is cross-sectional view illustrating a structure providing an ohmic contact to a P-type Group III-nitride based laser diode. As shown in FIG. 1, a laser structure 210 includes a substrate 212 on which is formed an epitaxial semiconductor structure 214 comprising one or more Group III-nitride materials. The epitaxial semiconductor structure 214 may include an N-type layer 215, a P-type layer 217, and an active layer 216 between the N-type and P-type layers. The active layer 216 may include any of a number of different structures and/or layers and/or combinations thereof, such as single or multiple quantum wells, double heterostructures, and/or superlattices. Active layer 216 may also include light and current confinement layers that may encourage laser action in the device.

Portions of the epitaxial structure 214 may be patterned into a mesa structure 220 for optical and current confinement purposes. A passivation layer 218 may protect and insulate exposed surfaces of the P-type layer 217. The passivation layer 218 may be a layer of an insulating material such as silicon dioxide, silicon nitride, aluminum oxide, and/or combinations thereof.

The laser structure 210 may include a first ohmic contact layer 226 on the P-type layer 217 and a second ohmic contact layer 227 on the substrate 212 opposite the epitaxial semiconductor structure 214. A metal overlayer 224 may be provided on the passivation layer 218 and on the first ohmic contact layer 226 to provide a conductive path for interconnection of the device 210 with an external circuit. The metal overlayer 224 may also provide some optical confinement for the device 210.

While the second ohmic contact 227 is shown on the substrate 212, the ohmic contact 227 may be provided on the N-type layer 215. In the device illustrated in FIG. 1, the substrate 212 may comprise a conductive material such as N-type silicon carbide to provide a "vertical" device having a "vertical" current path between the first and second ohmic contacts 226 and 227 through the epitaxial semiconductor structure 214 and the substrate 212. Stated in other words, the anode and cathode of the device are on opposite sides of the substrate 212. In a "horizontal" device, for example, the second ohmic contact could be placed on an exposed portion of the N-type layer 215 so that both ohmic contacts are on the same side of the substrate.

As shown in FIG. 1, the ohmic contact 226 on the P-type layer 217 can be formed within a via 222 that has been opened through the passivation layer 218 to expose a portion of the surface 220A of the mesa 220. More particularly, the mesa 220 can be fabricated by forming an epitaxial semiconductor layer, forming a photoresist layer on the epitaxial semiconductor layer, patterning the photoresist layer to expose portions of the semiconductor layer (using a technique known as photolithography), and etching the exposed portions of the epitaxial semiconductor layer to form the mesa 220. The epitaxial semiconductor structure 214 including the mesa 220 is then covered with the passivation layer 218, and a second patterned photoresist layer can be formed and patterned (using photolithography) on the passivation layer to expose a portion of the passivation layer where the via is to be formed. The exposed portion of the passivation layer can then be etched to form the via 222 exposing a portion of the mesa surface 220A.

A layer of a metal such as nickel, titanium, platinum, palladium, and/or combinations thereof can then be deposited on the portion of the mesa surface 220A exposed by the via 222. Because of tolerance limits of the two photolithography steps discussed above, however, it may be difficult to align the via 222 with the mesa surface 220A. Accordingly, the via 222 may need to be patterned to be significantly narrower than the mesa surface 220A so that the passivation layer 218 may extend onto significant portions of the mesa surface 220A and so that the ohmic contact 226 may not contact significant portions of the mesa surface 220A. Accordingly, electric current passing from the ohmic contact 226 to the mesa surface 220A may be distributed unevenly across the mesa and performance of the device may be degraded.

As shown in FIG. 1, the passivation layer 218 may cover corners 211 of the mesa 220. The corners 211 may be electrically vulnerable regions of the structure, and the passivation layer may provide protection therefore. More particularly, it may be desirable to protect the mesa corners 211 when the metal overlayer 224 is deposited. If the corners are not protected when the metal overlayer 224 is deposited, metal from the overlayer may migrate down the mesa 220 sidewalls which may cause current leakage, electrical short circuits, and/or an increase in a lasing threshold voltage. Providing the passivation layer 218 on the corners 211 of the mesa 220A may also protect mesa sidewalls from environmental conditions such as high humidity.

Figure 2:
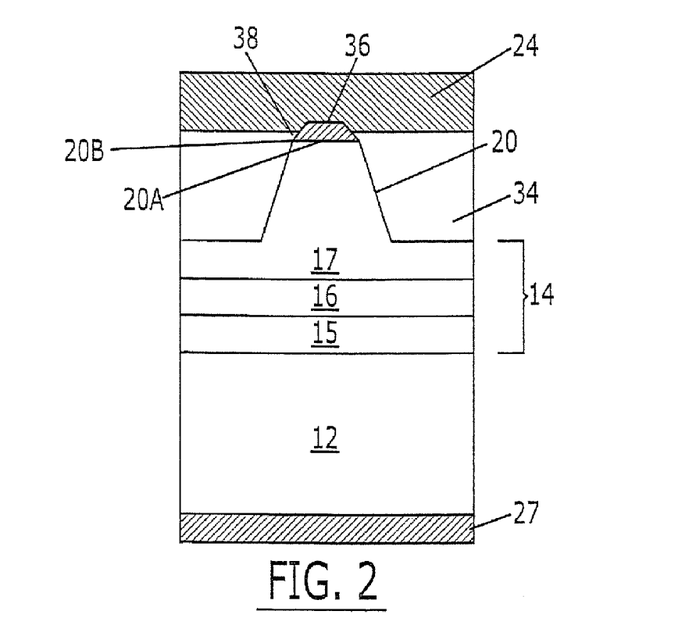
FIG. 2 is a cross-sectional view illustrating semiconductor laser structures according to embodiments of the present invention.

A laser diode structure according to embodiments of the present invention is illustrated in FIG. 2. As shown in FIG. 2, a laser diode structure may include a substrate 12 and an epitaxial semiconductor structure 14 including semiconductor materials such as Group III-V semiconductor materials, and more particularly, semiconductor materials such as Group III-nitride semiconductor materials. The epitaxial semiconductor structure 14 may include an N-type layer 15 and a P-type layer 17. The epitaxial semiconductor structure 14 may also include an active layer 16 between the N-type and P-type layers.

The substrate 12 may include a material such as N-type silicon carbide having a polytype such as 2H, 4H, 6H, 8H, 15R, and/or 3C; sapphire; gallium nitride; and/or aluminum nitride. By providing a conductive substrate, a "vertical"

device can be provided such that a current path is provided through the epitaxial semiconductor structure 14 and the substrate 12. As shown in FIG. 2, a "vertical" current path is provided between the ohmic contact layers 36 and 27 which are provided on opposite sides of the substrate 12. In an alternative, a "horizontal" device may be provided with both contacts on the same side of the substrate, in which case, the substrate may be insulating, semi-insulating, or conductive.

The active layer 16 may include a number of different structures and/or layers and/or combinations thereof. The active layer 16, for example, may include single or multiple quantum wells, double heterostructures, and/or superlattices. The active layer 16 may also include light and/or current confinement layers that may encourage laser action in the device.

Portions of the epitaxial semiconductor structure 14 may be patterned into a semiconductor mesa 20, for example, to provide optical and/or current confinement. As illustrated in FIG. 2, a portion of the P-type layer 17 may be included in the mesa 20 without including any of the N-type layer 15 in the mesa 20. In alternatives, portions or all of the active layer 16 and or the N-type layer 15 may be included in the mesa 20. A thickness of the mesa 20 (determined, for example, by a depth of an etch used to form the mesa) may be in the range of approximately 0.1 to 5 microns, and more particularly, the thickness of the mesa may be less than approximately 2.5 microns. A width of the mesa surface 20A (visible in the cross-section of FIG. 2) may be in the range of approximately 1 to 3 microns and a length of the mesa (perpendicular to the cross-section of FIG. 2) may be significantly greater.

As shown in FIG. 2, the ohmic contact 36 may be formed on the mesa surface 20A, and the ohmic contact 27 may be formed on the substrate 12 opposite the mesa 20. As further shown in FIG. 2, the ohmic contact 36 may be in direct contact with substantially an entire width of the mesa surface 20A.

The passivation layer 34 may protect and insulate exposed surfaces of the P-type layer 17, and the passivation layer 34 may be a layer of an insulating material such as silicon dioxide, silicon nitride, aluminum oxide, and/or combinations thereof. Moreover, the passivation layer may be formed using a deposition technique such as plasma enhanced chemical vapor deposition (PECVD), low pressure chemical vapor deposition (LPCVD), chemical vapor deposition (CVD), sputtering, and/or e-beam evaporation. As shown, the passivation layer 34 may extend across peripheral portions of the mesa surface 20A thereby covering potentially vulnerable corner portions 20B of the mesa 20 where the mesa surface 20A and mesa sidewalls meet. The passivation layer 34 may also cover portions of beveled sidewalls of the ohmic contact layer 36. Metal overlayer 24 may include a layer of a metal such as nickel, gold, platinum, titanium, molybdenum, tantalum, palladium, and/or combinations thereof. As shown, the metal overlayer 24 can be in contact with the ohmic contact layer 36 to facilitate electrical connection of the laser diode with an external device. The ohmic contact layer, for example, may provide a surface for wire and/or other bonding for electrical connection with another device.

Figure 3A:
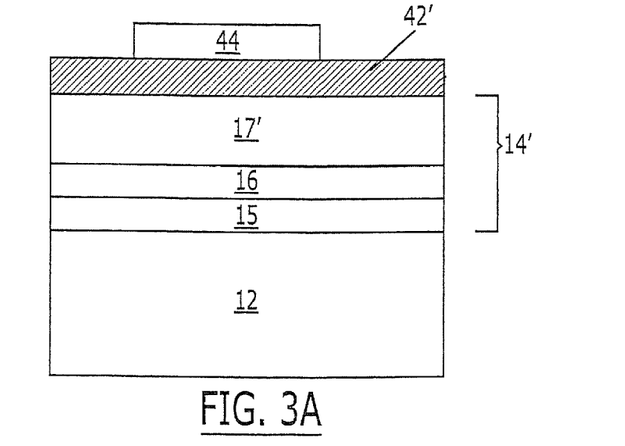
FIGS. 3A to 3F are cross-sectional views illustrating steps of forming semiconductor laser structures according to embodiments of the present invention.

Methods of fabricating laser diodes according to embodiments of the present invention are illustrated in the cross-sectionals views of FIGS. 3A to 3F. As shown in FIG. 3A, a laser diode precursor structure may include an epitaxial semiconductor structure 14' including an N-type layer 15 and a P-type layer 17'. The epitaxial semiconductor layer may also include an active layer 16 between the N-type and P-type layers. In addition, a metal layer 42' may include a metal stack that provides ohmic contact with the epitaxial semiconductor structure 14' opposite the substrate 12. In addition to providing ohmic contact with the epitaxial semiconductor structure 14', a metal stack of the metal layer 42' may also include other layers such as barrier and/or bonding layers as described, for example, in Published U.S. Patent Application No. 20030045015 (Ser. No. 10/185,252) and Published U.S. Patent Application No. 20030042507 (Ser. No. 10/185,350), the disclosures of which are hereby incorporated herein in their entirety by reference. A mask 44 is provided on the metal layer 42' to expose portions of the metal layer 42' and the epitaxial semiconductor structure 14'. For example, the mask 44 may be a photoresist mask that is patterned using photolithographic techniques. In an alternative, the mask 44 may be a layer of another material that can resist an etch chemistry used to etch the metal layer 42' and the epitaxial semiconductor structure 14'.

Figures 3B, 3C, 3D:
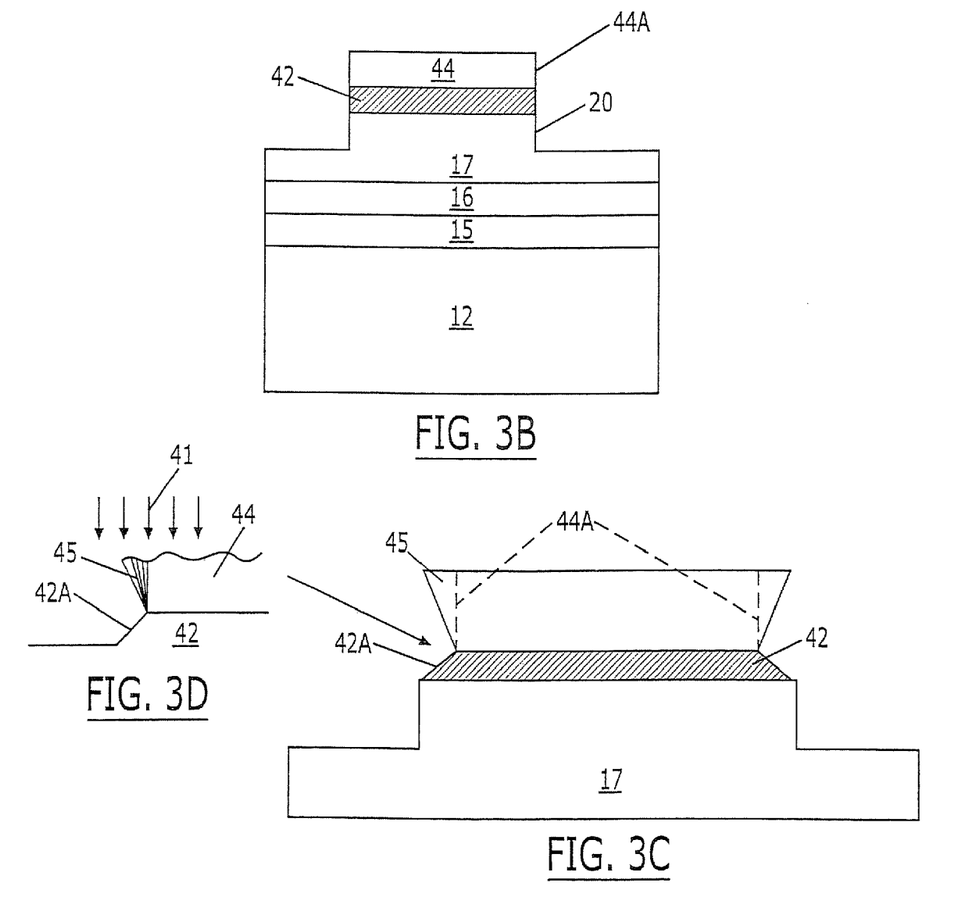

As shown in FIG. 3B, portions of the metal layer 42' and the epitaxial semiconductor structure 14' exposed by the mask 44 can be selectively removed, for example, using a dry etch, to provide the ohmic contact layer 42 and the mesa 20 including portions of the P-type layer 17. While the mesa 20 is shown exposing only portions of the P-type layer 17, exposed portions of the epitaxial semiconductor structure 14' may be removed to a greater depth so that all of the P-type layer 17 is included in the mesa, so that all or portions of the active layer 16 are included in the mesa, and/or so that all or portions of the N-type layer 15 are included in the mesa. For example, exposed portions of the metal layer 42' and the epitaxial semiconductor structure 14' can be removed down to the substrate 12.

Exposed portions of the metal layer 42' and the epitaxial semiconductor structure 14' can be removed using a dry etch such as a Reactive Ion Etch (RIE), an Electron Cyclotron Resonance (ECR) plasma etch, and/or an Inductively Coupled Plasma (ICP) etch. More particularly, the metal layer and the epitaxial semiconductor layer can be etched using a dry etch in an Argon (Ar) environment with a chlorine ($Cl_2$) etchant. For example, argon can flow at a rate in the range of approximately 2 to 40 sccm and chlorine can flow at a rate in the range of approximately 5 to 50 sccm in an RIE reactor at a pressure in the range of approximately 5 to 50 mTorr and at an RF power in the range of approximately 200 to 1000 W. These etch parameters are provided by way of example, and other etch parameters may be used.

FIGS. 3C and 3D illustrate the intersection of the ohmic contact layer 42 and the mask 44 in greater detail after completion of the mesa etch. As shown in FIG. 3C, residue 45 may build up on sidewalls 44A of the mask 44 as the etch progresses through the metal layer 42' to form the ohmic contact layer 42. The residue 45 may result from redeposition of material etched from the metal layer 42'. More particularly, when dry etching the metal layer 42', the metal layer 42' may be bombarded with reactive ions 41 as shown in FIG. 3D, and the reactive ions 41 may physically remove exposed portions of the metal layer 42'. Etch by-products such as ions 41 and/or etched material may form a residue 45 that builds up on sidewalls of the mask 44 as the etch of the metal layer 42' progresses. Because the residue 45 may effectively increase a width of the mask 44 as the etch progresses through the metal layer 42', an increasing area of the metal layer 42' may be shielded/shadowed from the etch as the depth of the etch increases. Accordingly, sidewalls 42A of the ohmic contact layer 42 may be inwardly beveled or slanted.

Once the metal layer 42' has been etched through to provide the ohmic contact layer 42 and etching of the P-type layer 17' begins, redeposition of etch by-products as residue 45 onto mask sidewalls 44A may be reduced and/or eliminated. Accordingly, sidewalls of the semiconductor mesa 20 may have a greater slope relative to the substrate than sidewalls 42A of the ohmic contact layer 42.

Figure 3E:
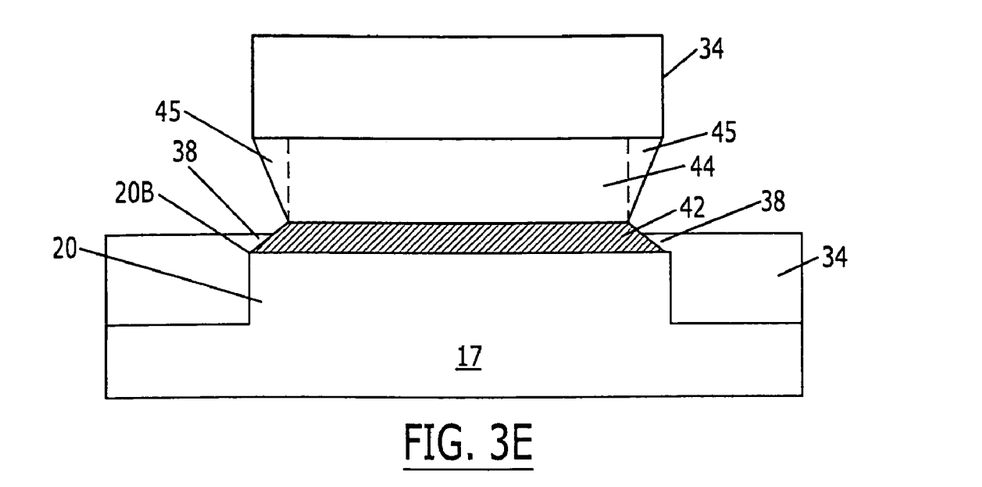

As shown in FIG. 3E, a passivation layer 34 is formed on exposed portions of the P-type layer 17, on the mask 34, and on portions of the beveled sidewalls of the ohmic contact layer 42. The passivation layer 34 may include a layer of an insulating material such as silicon nitride, silicon dioxide, and/or aluminum oxide. Moreover, the passivation layer 34 may be formed using a deposition technique such as plasma enhanced chemical vapor deposition (PECVD), low pressure chemical vapor deposition (LPCVD), chemical vapor deposition (CVD), sputtering, and/or e-beam evaporation. According to some embodiments, the passivation layer 34 may have a thickness that is slightly greater than a depth of the etch into the semiconductor layer. The passivation layer 34 may have a thickness in the range of approximately 0.1 to 2 microns with the etch depth into the semiconductor layer being slightly less than the thickness of the passivation layer.

Because the sidewalls of the ohmic contact layer 42 may be inwardly beveled, portions 38 of the passivation layer 34 on the inwardly beveled sidewalls of the ohmic contact layer 42 may cover corner portions of the semiconductor mesa 20. The portions 38 of the passivation layer 34 may thus provide electrical and/or physical protection for the corner portions of the semiconductor mesa 20. The mask 44 and portions of the passivation layer 34 on the mask can then be removed using a lift-off technique, and the resulting structure can be rinsed in de-ionized water. Portions 38 of the passivation layer 34 that overlap the semiconductor mesa 20 may thus effectively provide a self-aligned via surrounding and protecting the ohmic contact layer 42. Stated in other words, the same mask that is used to pattern the ohmic contact layer 42 and the semiconductor mesa 20 is also used to define a contact surface of the ohmic contact layer that is exposed through the passivation layer.

Figure 3F:
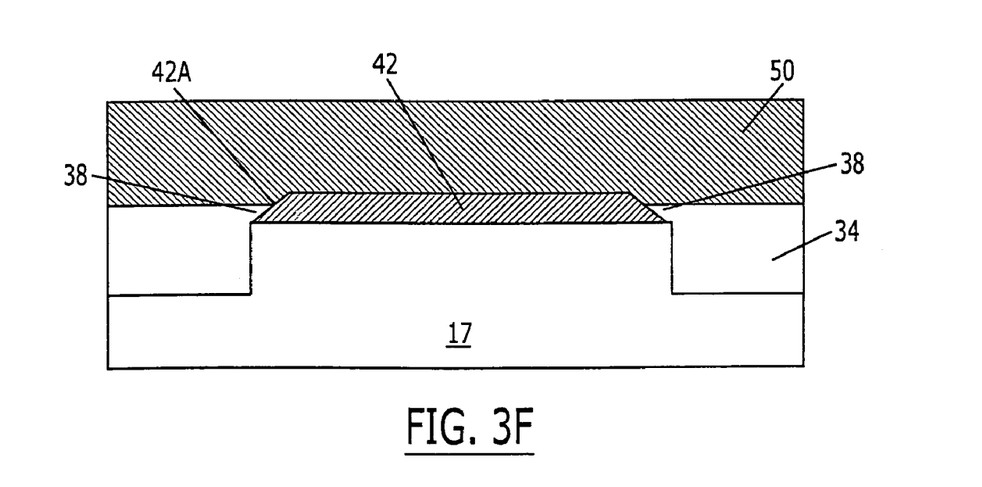
Figure 4:
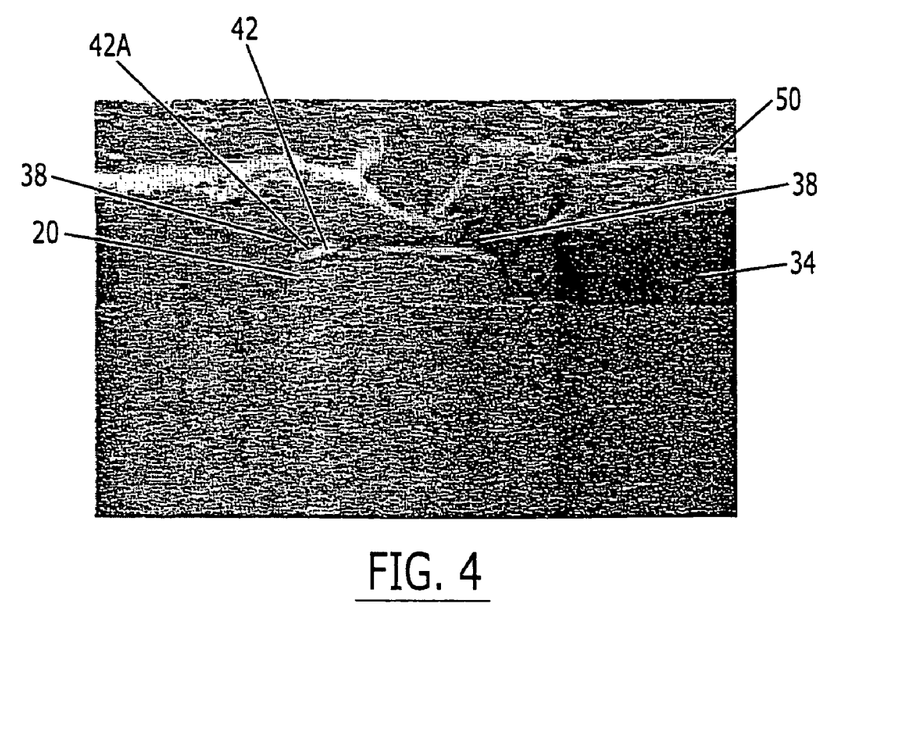
FIG. 4 is a scanning electron microscope photomicrograph of a cross-section of a semiconductor laser structure according to embodiments of the present invention.

A metal overlayer 50 can then be deposited on the passivation layer 34 and on exposed portions of the ohmic contact layer 42 as shown in FIG. 3F. The metal overlayer may be a layer of a metal such as nickel, gold, platinum, titanium, tungsten, molybdenum, tantalum, palladium, and/or combinations thereof. Portions 38 of the passivation layer 34 may thus define a self-aligned via to allow contact between the ohmic contact layer 42 and the metal overlayer 50 while reducing the possibility of contact between the metal overlayer 50 and the P-type layer. By reducing the possibility of contact between metal overlayer 50 and the semiconductor mesa 20, leakage currents, short circuits, and/or threshold voltages may be reduced. FIG. 4 is a photograph illustrating mesa structures according to embodiments of the present invention.

Additional embodiments of the present invention are discussed with reference to FIG. 5. As shown in the cross-sectional view of FIG. 5, a semiconductor device according to embodiments of the present invention can include a substrate 112, and a semiconductor structure 114 on the substrate 112 with the semiconductor structure 114 including a semiconductor mesa 120 having semiconductor mesa sidewalls 120A and a semiconductor mesa surface 120B opposite the substrate 112. An ohmic contact layer 136 on the semiconductor mesa surface 120B can include sidewalls 136A and a contact surface 136B opposite the semiconductor mesa surface 120B, and the ohmic contact layer 136 can extend substantially across an entirety of the semiconductor mesa surface 120B. A passivation layer 134 can be provided on the semiconductor mesa sidewalls 120A and on portions of the ohmic contact layer sidewalls 136A adjacent the semiconductor mesa surface 120B, and the passivation layer 134 can expose substantially an entirety of the contact surface 136B of the ohmic contact layer 136. Portions of the ohmic contact layer sidewalls 136A adjacent the contact surface 136B may also be exposed by the passivation layer 134.

More particularly, the ohmic contact layer sidewalls 136A can be inwardly beveled, and the passivation layer 134 may extend onto the inwardly beveled sidewalls of the ohmic contact layer adjacent the semiconductor mesa sidewalls 120A. Portions of the ohmic contact layer sidewalls 136A adjacent the semiconductor mesa surface 120B may be covered by the passivation layer 134, and portions of the ohmic contact layer sidewalls 136A adjacent the contact surface 136B may be free of the passivation layer 134. Moreover, the semiconductor mesa sidewalls 120A of the semiconductor structure 114 may have a first slope relative to the substrate and the ohmic contact layer sidewalls 136A may have a second slope relative to the substrate wherein the second slope is less than the first slope.

By providing the passivation layer 134 on portions of the ohmic contact layer sidewalls 136A adjacent the semiconductor mesa surface, the passivation layer can protect corner portions of the semiconductor mesa 120 between the semiconductor mesa sidewalls 120A and the semiconductor mesa surface 120B. As shown in FIG. 5, the semiconductor device can also include a conductive overlayer 124 on the passivation layer 134 and on exposed portions of the ohmic contact layer 136. More particularly, the conductive overlayer 124 can provide electrical contact with the contact surface 136B and exposed portions of the ohmic contact layer sidewalls 136A to provide a current path through the semiconductor mesa 120 of the semiconductor structure 114. In addition, a second contact layer 127 can be provided on the substrate 112 opposite the semiconductor structure 114 so that a "vertical" current path is defined between the conductive overlayer 124 and the second contact layer 127 through the ohmic contact layer 136, the semiconductor structure 114, and the substrate 112. In an alternative, a second contact layer may be provided on a surface of the substrate 112 adjacent the semiconductor structure 114 or on a surface of the semiconductor structure 114 adjacent the semiconductor mesa to define a "horizontal" current path.

According to particular embodiments of the present invention, the semiconductor structure 114 may include a first layer of a first conductivity type and a second layer of a second conductivity type on the first layer opposite the substrate 112. More particularly, the first layer may be an N-type layer and the second layer may be a P-type layer so that a P-N junction is defined therebetween. In addition, the semiconductor device may be a light emitting device so that light is emitted responsive to electrical current passing through the P-N junction. More particularly, the semiconductor device may be a semiconductor laser so that coherent light is emitted from the semiconductor mesa structure 114 parallel to the substrate and perpendicular to the plane of the cross-section.

The semiconductor mesa sidewalls 120A may expose portions of the second layer of the second conductivity type without exposing portions of the first layer of the first conductivity type. Accordingly, the P-N junction can be located in the semiconductor structure 114 below the semiconductor mesa 120. In an alternative, the semiconductor mesa sidewalls 120A may expose portions of both the first layer of the first conductivity type and the second layer of the second conductivity type. Accordingly, the P-N junction can be located in the semiconductor mesa 120 of the semiconductor structure 114.

The semiconductor structure 114 can also include an active layer between the first and second layers of the first and second conductivity types. An active layer may include different structures and/or layers an/or combinations thereof, such as single or multiple quantum wells, double heterostructures, and/or superlattices. An active layer may also include light and/or current confinement layers that may encourage laser action in the device.

According to embodiments of the present invention, portions of the semiconductor structure 114 included in the semiconductor mesa 120 may have a thickness in the range of approximately 0.1 to 5 microns. According to additional embodiments of the present invention, portions of the semiconductor structure 114 included in the semiconductor mesa 120 have a thickness of less than approximately 2.5 microns. In addition, the semiconductor mesa surface 120B of the semiconductor structure 114 can have a width in the range of approximately 1 to 3 microns where the width is the lateral dimension of the semiconductor mesa surface 120B visible in the cross-section of FIG. 5.

Figure 5:
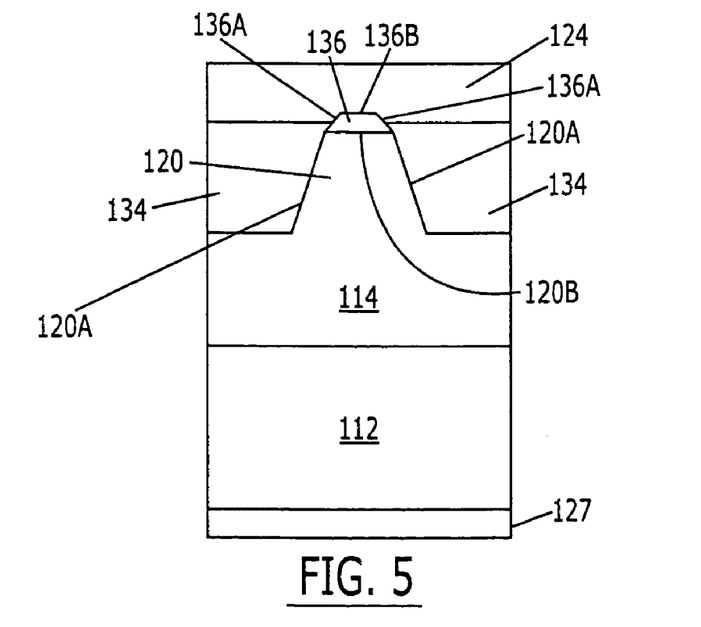
FIG. 5 is a cross-sectional view illustrating semiconductor device structures according to embodiments of the present invention.

The length of the mesa 120 is the dimension of the mesa perpendicular to the cross-section of FIG. 5, and the length of the mesa may be significantly greater than the width. By providing the length significantly greater than the width, the mesa may provide current and/or optical confinement when providing a semiconductor laser device.

As shown in FIG. 5, the semiconductor structure 114 may have a semiconductor mesa 120 and a non-patterned portion between the semiconductor mesa 120 and the substrate 112 so that at least a portion of the first layer of the first conductivity type is not included in the semiconductor mesa 120. In an alternative, the semiconductor mesa sidewalls 120A may extend from the semiconductor mesa surface 120B to the substrate 112 so that all of the first layer of the first conductivity type is included in the semiconductor mesa 120.

The semiconductor structure 114 may comprise a Group III-V semiconductor material such as a Group III-nitride semiconductor material. Moreover, the substrate 112 may comprise N-type silicon carbide having a polytype selected from 2H, 4H, 6H, 8H, 15R, and/or 3C. The substrate could alternately comprise another material such as sapphire, gallium nitride, and/or aluminum nitride. The substrate 112 may be conductive when the second contact layer 127 is provided on a side thereof opposite the semiconductor structure 114. Non-conductive substrate materials, however, may be used if a current path is not provided through the substrate 112. Moreover, the term substrate may be defined to include a non-patterned portion of the semiconductor material making up the semiconductor structure 114, and/or there may not be a material transition between the substrate 112 and the semiconductor structure 114. Moreover, the semiconductor structure may be an epitaxial semiconductor structure.

The conductive overlayer 124 may be a metal layer such as a layer of nickel (Ni), gold (Au), platinum (Pt), titanium (Ti), tungsten (W), molybdenum (Mo), tantalum (Ta), and/or palladium (Pd). The passivation layer may be a layer of an insulating material such as a layer of silicon nitride, silicon oxide, and/or aluminum oxide. Moreover, the passivation layer may be formed using one or more of chemical vapor deposition (CVD), plasma enhanced chemical vapor deposition (PECVD), low pressure chemical vapor deposition (LPCVD), sputtering, and/or e-beam evaporation.

Figure 6A:
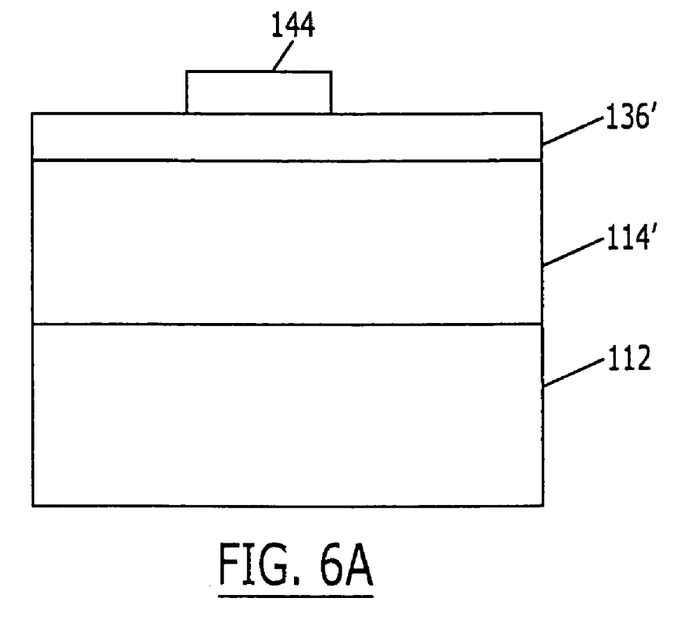
FIGS. 6A-6D are cross-sectional views illustrating steps of forming semiconductor device structures according to embodiments of the present invention.

FIGS. 6A-6D illustrate steps of forming the semiconductor device illustrated in FIG. 5. As shown in FIG. 6A, a semiconductor layer 114' may be formed on a substrate 112, and a conductive layer 136' may be formed on the semiconductor layer 114' opposite the substrate 112, and a mask 144 may be formed on the conductive layer 136' opposite the semiconductor layer 114'. As discussed above, the substrate may comprise a material such as N-type silicon carbide substrate having a polytype such as 2H, 4H, 6H, 8H, 15R, and 3C; sapphire; gallium nitride; and/or aluminum. The conductive layer 136' may comprise a metal such as nickel, titanium, platinum, and/or palladium, and the mask 144 may be a photoresist mask or other masking material that can resist an etch used to pattern the conductive layer 136' and the semiconductor layer 114'.

The semiconductor layer 114' may comprise a semiconductor material such as a Group III-V semiconductor material, and more particularly a Group III-nitride material. Moreover, the semiconductor material may comprise a first layer of a first conductivity type and a second layer of a second conductivity type on the first layer opposite the substrate. More particularly, the first layer may be an N-type semiconductor layer on the substrate 112, and the second layer may be a P-type semiconductor layer on the N-type semiconductor layer opposite the substrate so that a P-N junction is defined therebetween. Moreover, forming the semiconductor layer may include forming an epitaxial semiconductor layer.

In addition, the semiconductor layer may include an active layer between the N-type and P-type layers. An active layer may include different structures and/or layers an/or combinations thereof, such as single or multiple quantum wells, double heterostructures, and/or superlattices. An active layer may also include light and/or current confinement layers that may encourage laser action in the device.

Figure 6B:
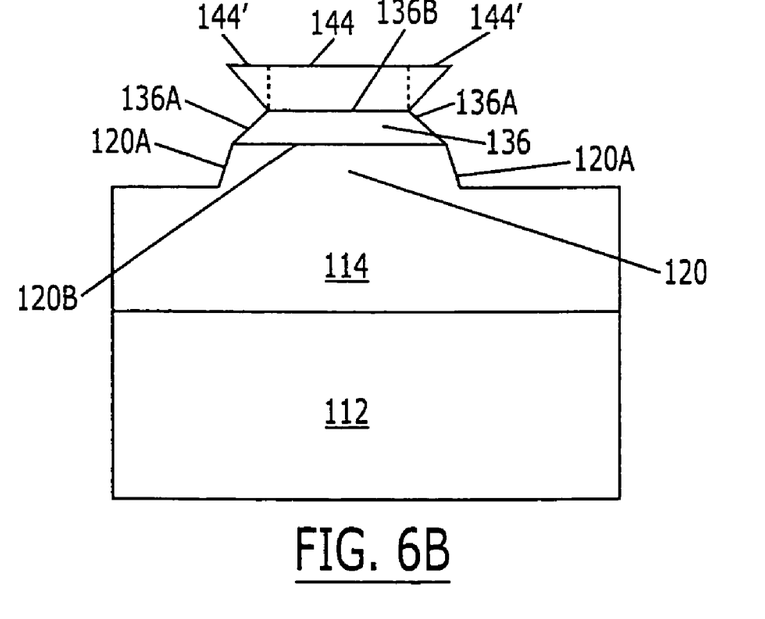

As shown in FIG. 6B, portions of the conductive layer 136' and the semiconductor layer 114' exposed by the mask 144 are selectively removed to define the ohmic contact layer 136 and the semiconductor structure 114 including a semiconductor mesa 120 having semiconductor mesa sidewalls 120A and a semiconductor mesa surface 120B. Portions of the conductive layer and the semiconductor layer can be selectively removed using a dry etch such as a Reactive Ion Etch (RIE), an Electron Cyclotron Resonance (ECR) plasma etch, and/or an Inductively Coupled Plasma (ICP) etch. The semiconductor layer, for example, may be etched using a dry etch in a Argon (Ar) environment with a chlorine ($Cl_2$) etchant. More particularly, the dry etch may be performed by flowing Ar at a flow in the range of approximately 2-40 sccm and flowing $Cl_2$ at a flow in the range of approximately 5-50 sccm in an RIE reactor at a pressure in the range of approximately 5-50 mTorr and at a radio frequency (RF) power in the range of approximately 200-1000 W. These process conditions are provided by way of example, and other process conditions may be used in accordance with embodiments of the present invention.

According to embodiments of the present invention, the semiconductor layer 114' may be etched to at depth in the range of approximately 0.1 to 5 microns. According to additional embodiments of the present invention, the semiconductor layer 114' may be etched to a depth of less than approximately 2.5 microns. The depth of the etch will determine the thickness of the semiconductor mesa 120. As discussed above, the semiconductor layer 114' may include a first conductivity-type layer (such as an N-type layer) on the substrate and a second conductivity-type layer (such as a P-type layer) on the first conductivity-type layer opposite the substrate. Moreover, the etch depth may be such that only portions of the second conductivity-type layer are exposed along the resulting mesa sidewalls 120A. In an alternative, the etch depth may be such that portions of the first conductivity-type layer are also exposed along the resulting mesa sidewalls 120A. While the etch is shown extending through only a portion of the thickness of the semiconductor layer 114', the etch could extend through the entire thickness of the semiconductor layer so that portions of the substrate 112 are exposed adjacent the mesa sidewalls 120A. Moreover, the mask 144 can be provided so that the mesa surface 120B has a width in the range of approximately 1 to 3 microns.

As shown in FIG. 6B, a residue 144' may build up on sidewalls of the mask 144 as a dry etch progresses through the conductive layer 136'. More particularly, portions of the conductive layer 136' may be physically removed by bombarding electrons during a dry etch, and some of this removed material may generate the residue that builds up on sidewalls of the mask. Because the residue builds over time, a greater portion of the conductive layer may be shielded from the etch as the etch depth increases so that the sidewalls 136A of the ohmic contact layer 136 are inwardly beveled. Once the etch is completed through the conductive layer 136', etching of the semiconductor layer 114' may result in reduced generation of etch residue on the mask sidewalls so that the slopes of the semiconductor mesa sidewalls 120A may be greater than the slopes of the ohmic contact layer sidewalls 136A.

Because the ohmic contact layer 136 and the semiconductor mesa 120 are patterned at the same time, the ohmic contact layer 136 can provide coverage across substantially an entirety of the semiconductor mesa surface 120B without extending onto mesa sidewalls 120B. The ohmic contact layer 136 can thus be "self aligned" with respect to the semiconductor surface 120B. Accordingly, improved current spreading can be provided for an electronic device with a current flow through the mesa surface. In addition, the ohmic contact layer 136 may provide improved protection for corners of the semiconductor mesa 120.

Figure 6C:
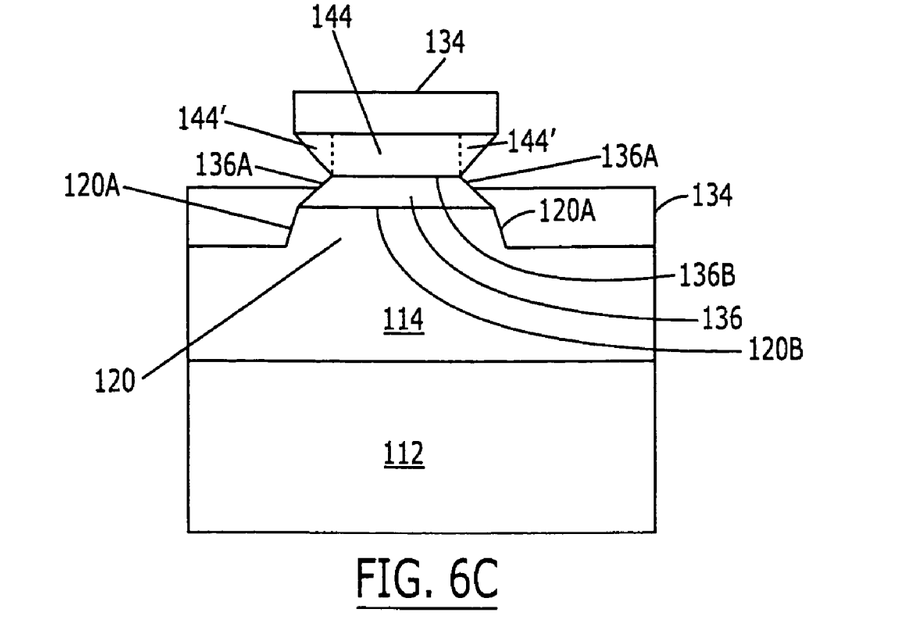

As shown in FIG. 6C, a passivation layer 134 can be formed on sidewalls 120A of the semiconductor mesa 120 and on the mask 144. Stated in other words, the mask 144 is maintained while forming the passivation layer. The passivation layer may also be formed on portions the ohmic contact layer sidewalls 136A adjacent the semiconductor mesa surface 120B. Because the mask is maintained while forming the passivation layer, the passivation layer is not formed directly on the contact surface 136B of the ohmic contact layer. Due to shielding of the residue 144', portions of the ohmic contact layer sidewalls 136A adjacent the contact surface 136B may also be maintained free of the passivation layer. By providing the passivation layer on portions of the inwardly beveled sidewalls 136A of the ohmic contact layer 136, additional protection may be provided for corners of the semiconductor mesa 120.

The passivation layer 134 may be a layer of an insulating material such as silicon nitride, silicon oxide, and/or aluminum oxide. Moreover, the passivation layer may be formed using chemical vapor deposition (CVD), plasma enhanced chemical vapor deposition (PECVD), low pressure chemical vapor deposition (LPCVD), sputtering, and/or e-beam evaporation. According to embodiments of the present invention, the passivation layer is formed to have a thickness greater than a thickness of the semiconductor mesa 120 (i.e. a depth of the etch into the semiconductor layer 144') but less than a combined thickness of the semiconductor mesa 120 and the ohmic contact layer 136. Accordingly, the passivation layer may cover the semiconductor mesa sidewalls 120A and portions of the ohmic contact layer sidewalls 136A, but the ohmic contact surface 136B may still extend through the passivation layer. The passivation layer may have a thickness in the range of approximately 0.1 to 2.0 microns with the thickness of the semiconductor mesa 120 being slightly less.

Figure 6D:
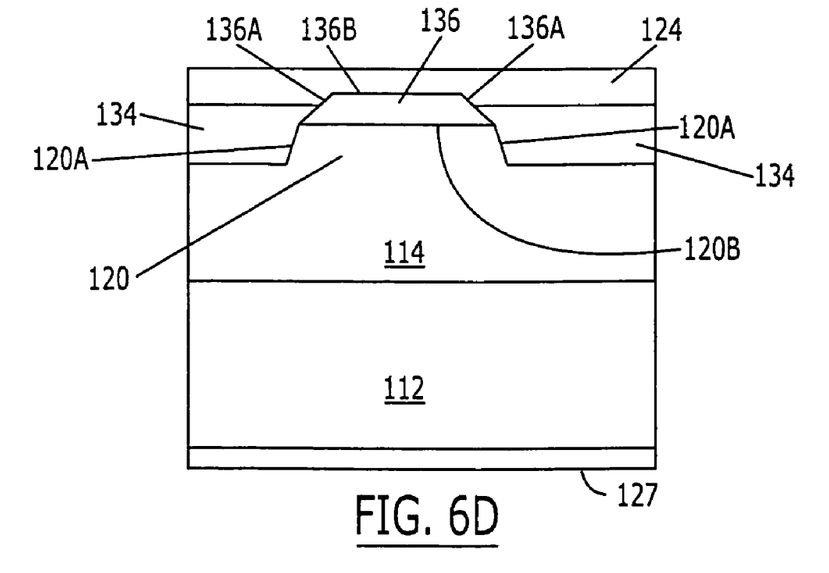

The mask 144 and portions of the passivation layer 134 on the mask can then be removed thereby exposing the contact surface 136B of the ohmic contact layer 136, for example, using a lift-off technique. The contact surface 136B can thus be exposed through the passivation layer without using a separate masking step to form a via through the passivation layer. Stated in other words, the passivation layer can be "self aligned" with respect to the ohmic contact layer. A conductive overlayer 124 is then formed on the contact surface 136B and on portions of the passivation layer 134 surrounding the ohmic contact layer 136. More particularly, the conductive overlayer 124 may comprise a metal such as nickel (Ni), gold (Au), platinum (Pt), titanium (Ti), tungsten (W), molybdenum (Mo), tantalum (Ta), and/or palladium (Pd). The conductive overlayer may provide a large area contact for a wire bond or other interconnection.

In addition, a second ohmic contact 127 may be provided on the substrate 112 opposite the semiconductor mesa 120. While the second ohmic contact is shown as being formed after forming the semiconductor mesa 120, the second ohmic contact 127 may be formed at any point during the fabrication of the semiconductor device. With the second ohmic contact provided on the substrate opposite the semiconductor device, a "vertical" current path may be provided through the semiconductor mesa and the substrate. In an alternative, a second ohmic contact may be provided on a surface of the substrate adjacent the semiconductor mesa, or a second ohmic contact may be formed on a portion of the semiconductor layer 114 opposite the substrate to provide a "horizontal" current path.

The resulting semiconductor device may provide an edge emitting semiconductor laser with light being emitted parallel to the substrate along a lengthwise direction of a semiconductor mesa stripe. Stated in other words, the light may be emitted along a direction perpendicular to the cross section of FIG. 6D. While methods and devices have been discussed with reference to methods of forming light emitting devices such as laser diodes, methods according to embodiments of the present invention may be used to form other semiconductor devices such as conventional diodes, conventional light emitting diodes, or any other semiconductor device including a semiconductor mesa.

While this invention has been particularly shown and described with reference to preferred embodiments thereof, it will be understood by those skilled in the art that various changes in form and details may be made therein without departing from the spirit and scope of the invention as defined by the appended claims and their equivalents.

That which is claimed:

1. A semiconductor device comprising:
a semiconductor structure including a mesa having mesa sidewalls and a planar mesa surface;
a metal contact layer on the planar mesa surface, the metal contact layer having sidewalls and a contact surface opposite the planar mesa surface, the metal contact layer extending across substantially an entirety of the planar mesa surface so that an entirety of a surface of the metal contact layer adjacent the mesa is planar and so that the mesa sidewalls are free of the metal contact layer; and
an insulating passivation layer on the mesa sidewalls and on portions of the metal contact layer sidewalls adjacent the planar mesa surface, wherein the insulating passivation layer exposes substantially an entirety of the contact surface of the metal contact layer.

2. A semiconductor device according to claim 1 wherein the semiconductor structure comprises a Group III-V semiconductor material.

3. A semiconductor device according to claim 2 wherein the semiconductor structure comprises a Group III-nitride semiconductor material.

4. A semiconductor device according to claim 1 wherein the semiconductor structure comprises a first layer of a first conductivity type and a second layer of a second conductivity type on the first layer.

5. A semiconductor device according to claim 4 wherein the mesa sidewalls expose portions of the second layer of the second conductivity type without exposing portions of the first layer of the first conductivity type.

6. A semiconductor device according to claim 4 wherein the mesa sidewalls expose portions of the first layer of the first conductivity type and portions of the second layer of the second conductivity type.

7. A semiconductor device according to claim 4 wherein the semiconductor structure further comprises an active layer between the first and second layers.

8. A semiconductor device according to claim 1 wherein portions of the semiconductor structure included in the mesa have a thickness in the range of approximately 0.1 to 5 microns.

9. A semiconductor device according to claim 8 wherein portions of the semiconductor structure included in the mesa have a thickness of less than approximately 2.5 microns.

10. A semiconductor device according to claim 1 wherein the planar mesa surface of the semiconductor structure has a width in the range of approximately 1 to 3 microns.

11. A semiconductor device according to claim 1 further comprising:
a conductive overlayer on the exposed portions of the metal contact layer and on portions of the insulating passivation layer surrounding the metal contact layer.

12. A semiconductor device according to claim 11 wherein the conductive overlayer comprises a metal layer.

13. A semiconductor device according to claim 12 wherein the conductive overlayer comprises at least one of nickel (Ni), gold (Au), platinum (Pt), titanium (Ti), tungsten (W), molybdenum (Mo), tantalum (Ta), and/or palladium (Pd).

14. A semiconductor device according to claim 1 wherein the insulating passivation layer comprises at least one of silicon nitride, silicon oxide, and/or aluminum oxide.

15. A semiconductor device according to claim 1 wherein the insulating passivation layer exposes portions of the metal contact layer sidewalls adjacent the contact surface.

16. A semiconductor device according to claim 1 wherein the mesa is configured to provide at least one of optical confinement or current confinement for a light emitting device in the semiconductor structure.

17. A semiconductor structure according to claim 1 wherein the mesa sidewalls are free of the metal contact layer.

18. A semiconductor structure according to claim 1 further comprising:
a substrate wherein the semiconductor structure including the mesa is on the substrate and wherein the mesa is between the planar mesa surface and the substrate.

19. A semiconductor structure according to claim 18 wherein the substrate comprises a single crystal semiconductor substrate, wherein the mesa comprises a single crystal semiconductor mesa, and wherein the single crystal semiconductor substrate and the single crystal semiconductor mesa have aligned crystal structures.

20. A semiconductor device according to claim 1 wherein the mesa sidewalls of the semiconductor structure have a first slope relative to the planar mesa surface and portions of the metal contact layer sidewalls directly on the insulating passivation layer have a second slope relative to the planar mesa surface wherein the second slope is less than the first slope.

21. A semiconductor device according to claim 1 wherein the metal contact layer comprises nickel, titanium, platinum, and/or palladium.

22. A semiconductor device according to claim 1 wherein the metal contact layer sidewalls are inwardly beveled with a width of the metal contact layer adjacent the planar mesa surface being greater than a width of the metal contact layer opposite the planar mesa surface, wherein the insulating passivation layer extends directly onto the inwardly beveled sidewalls of the metal contact layer opposite the planar mesa surface.

23. A semiconductor device according to claim 22 wherein the insulating passivation layer exposes portions of the inwardly beveled metal contact layer sidewalls adjacent the contact surface.

24. A semiconductor device comprising:
a semiconductor structure including a mesa having mesa sidewalls and a mesa surface;
a metal contact layer on the mesa surface, the metal contact layer having sidewalls and a contact surface opposite the mesa surface, the metal contact layer extending across substantially an entirety of the mesa surface; and
an insulating passivation layer on the mesa sidewalls and on portions of the metal contact layer sidewalls adjacent the mesa surface, wherein the insulating passivation layer exposes substantially an entirety of the contact surface of the metal contact layer;
wherein the metal contact layer sidewalls are inwardly beveled with a width of the metal contact layer adjacent the mesa surface being greater than a width of the metal contact layer opposite the mesa surface,
wherein the insulating passivation layer extends directly onto the inwardly beveled sidewalls of the metal contact layer opposite the mesa surface.

25. A semiconductor device according to claim 24 wherein the insulating passivation layer exposes portions of the inwardly beveled metal contact layer sidewalls adjacent the contact surface.

26. A semiconductor device according to claim 24 wherein the mesa sidewalls of the semiconductor structure have a first slope relative to the mesa surface and portions of the metal contact layer sidewalls directly on the insulating passivation layer have a second slope relative to the mesa surface wherein the second slope is less than the first slope.

27. A semiconductor device comprising: a semiconductor structure including a mesa having mesa sidewalls and a mesa surface;
a metal contact layer on the mesa surface, the metal contact layer having sidewalls and a contact surface opposite the mesa surface, the metal contact layer extending across substantially an entirety of the mesa surface; and
an insulating passivation layer on the mesa sidewalls and directly on portions of the metal contact layer sidewalls adjacent the mesa surface, wherein the insulating passivation layer exposes substantially an entirety of the contact surface of the metal contact layer:
wherein the mesa sidewalls of the semiconductor structure have a first slope relative to the mesa surface and portions of the metal contact layer sidewalls directly on the insulating passivation layer have a second slope relative to the mesa surface wherein the second slope is less than the first slope.

28. A semiconductor device according to claim 27 wherein the metal contact layer sidewalls are inwardly beveled with a width of the metal contact layer adjacent the mesa surface being greater than a width of the metal contact layer opposite the mesa surface,
wherein the insulating passivation layer extends directly onto the inwardly beveled sidewalls of the metal contact layer opposite the mesa surface.

29. A semiconductor device according to claim 28 wherein the insulating passivation layer exposes portions of the inwardly beveled metal contact layer sidewalls adjacent the contact surface.

* * * * *

UNITED STATES PATENT AND TRADEMARK OFFICE
CERTIFICATE OF CORRECTION

| | |
|---|---|
| PATENT NO. | : 7,613,219 B2 |
| APPLICATION NO. | : 11/520383 |
| DATED | : November 3, 2009 |
| INVENTOR(S) | : Haberern et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 540 days.

Signed and Sealed this

Nineteenth Day of October, 2010

David J. Kappos
*Director of the United States Patent and Trademark Office*